ASSEMBLY HAVING A CHASSIS AND REMOVABLY MOUNTED PANELS

Filed Oct. 30, 1967 2 Sheets-Sheet 1

Inventors
RICHARD C. OELER
EDWARD A. SALNERS
BY Mueller, Aichele & Rauner
ATTYS.

Dec. 23, 1969 R. C. OELER ET AL 3,486,077

ASSEMBLY HAVING A CHASSIS AND REMOVABLY MOUNTED PANELS

Filed Oct. 30, 1967 2 Sheets-Sheet 2

Inventors
RICHARD C. OELER
EDWARD A. SALNERS
BY
Mueller, Aichele & Rauner
ATTYS.

United States Patent Office 3,486,077
Patented Dec. 23, 1969

3,486,077

ASSEMBLY HAVING A CHASSIS AND REMOVABLY MOUNTED PANELS

Richard C. Oeler, Elmhurst, and Edward A. Salners, Mount Prospect, Ill., assignors to Motorola, Inc., Franklin Park, Ill., a corporation of Illinois Filed Oct. 30, 1967, Ser. No. 679,086
Int. Cl. H02b 1/04, 9/00, 1/02
U.S. Cl. 317—101 10 Claims

ABSTRACT OF THE DISCLOSURE

The assembly includes connector plugs snap mounted onto a chassis. A number of panels are provided, each having associated components and a plurality of sockets electrically connected to such components. Each plug has a plurality of pins connected by leads to other panels, with the sockets removably receiving associated pins.

BACKGROUND OF THE INVENTION

The components such as resistors, capacitors and inductors in present day television receivers are soldered on a combination of printed circuit boards and terminal strips permanently mounted on a main chassis. Electrical connections between components are provided by wires soldered to and between the circuit boards and the terminal strips. When a malfunction occurs in such a receiver, a serviceman must employ one or more of a variety of complex techniques to determine which of the many hundreds of components has become damaged. He must remove the damaged components by heating the appropriate solder joints which operation subjects the terminal strips and the printed circuit boards to damage and the possibility of destroying adjacent solder joints. The holes for receiving the components must be cleaned out and new components inserted and soldered in. It may be appreciated that all of this is time consuming and, as a result, costly to the owner of the television receiver. These disadvantages are also manifest as an increase in the cost of the receiver due to the increased time required to locate and replace components during receiver alignment.

SUMMARY OF THE INVENTION

It is, therefore, an object of this invention to provide printed circuit boards in the form of panels which are removably mounted onto a chassis and removably connected to other panels and circuits.

A further object of this invention is to provide a television receiver which is rapidly and easily serviceable.

Another object is to provide a television receiver with electrical systems which are individually removable without requiring heating of solder joints.

The assembly according to the invention includes a chassis having an opening and a plurality of selectively spaced slots adjacent the opening. A connector plug has a plurality of members spaced to snap engage the slots in the chassis. A plurality of selectively spaced electrically conductive pins are permanently attached to the connector plug and extend from opposite surfaces of the plug. A panel with electrical components mounted thereon has a plurality of sockets each individually removably receiving the portion of associated pins extending from one surface of the plug. A plurality of conductors are connected to the portion of associated pins extending from the other surface of the plug. These conductors are connected to other panels and circuits on the chassis for translating electrical currents.

DETAILED DESCRIPTION OF THE PREFERRED EMBODIMENTS

Figure 1:
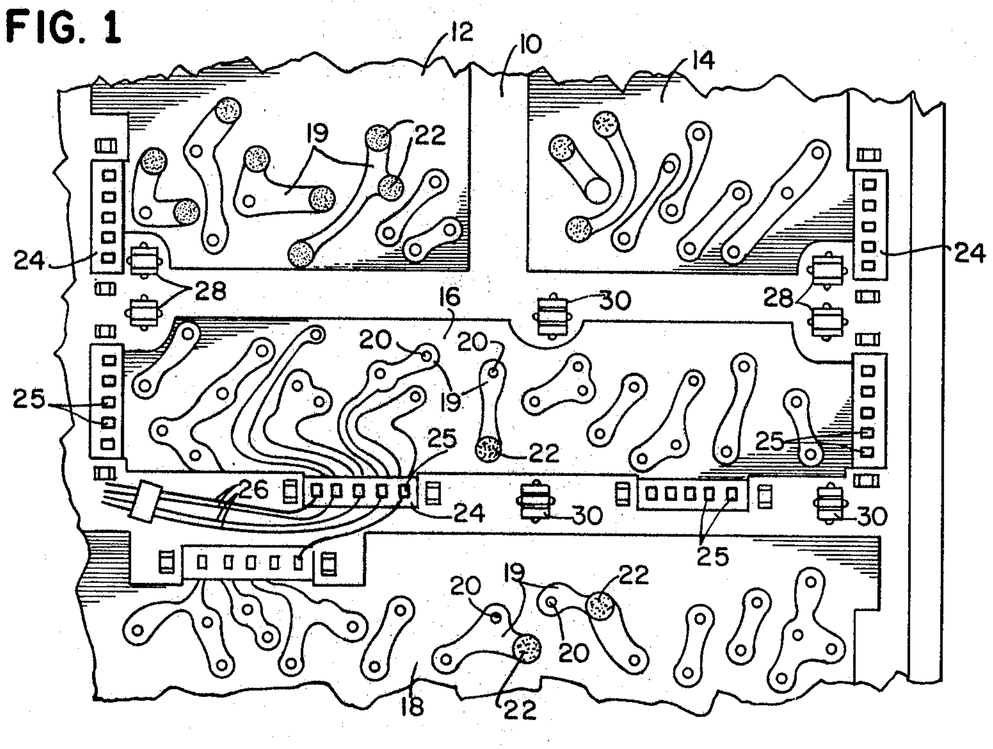
FIG. 1 illustrates a number of panels mounted on a receiver chassis.

Referring now to FIG. 1 there is shown a portion of a television receiver having a metal chassis 10 and a number of individual panels 12–18 each comprising an insulation backing and a multiplicity of conductive strips 19 in the form of an etched or plated circuit. The side of the panels having the circuit pattern will hereinafter be referred to as the pattern side. Electrical components such as resistors, transistors, etc., are mounted on the side (hereinafter referred to as the component side) of the panels not shown in FIG. 1. The leads of the components are inserted through holes 20 and soldered to the conductive strips 19 as indicated by numerals 22. A number of socket banks (shown in FIGS. 2 and 3) are permanently mounted on and extend outwardly from the component side of the panels. A corresponding number of connector plugs 24 are snap mounted to the chassis 10 and each has pins 25 removably inserted in an associated socket. The pins are connected through conductors 26 to other panels mounted on the chassis or to external circuits such as the cathode ray tube. In order to preclude the conductive strips 19 on the pattern side of the panels from becoming shorted to the metal chassis 10 and to locate and position the panels 12–18, the insulating spacers 28 are interposed between and removably attached to the panels and the chassis 10. Where an electrical connection is to be made from the panels to the chassis in order to reference particular conductive strips 19 to a common reference potential, conductive spacer 30 is used to locate and position a part of the particular panel.

Figure 2:
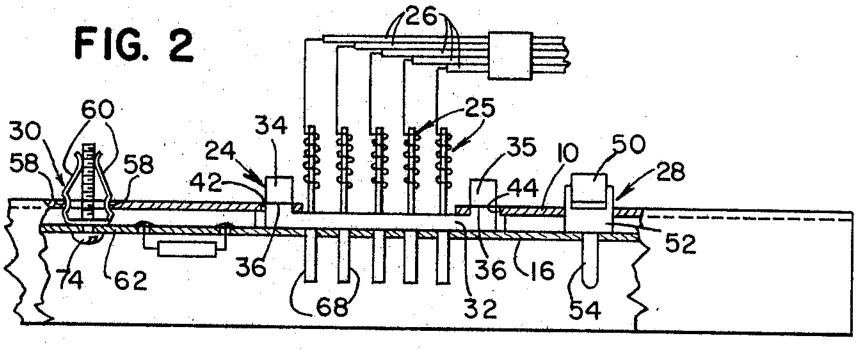
FIG. 2 illustrates, on an enlarged scale, an end view of one panel mounted on the chassis in FIG. 1.
Figures 3, 10:
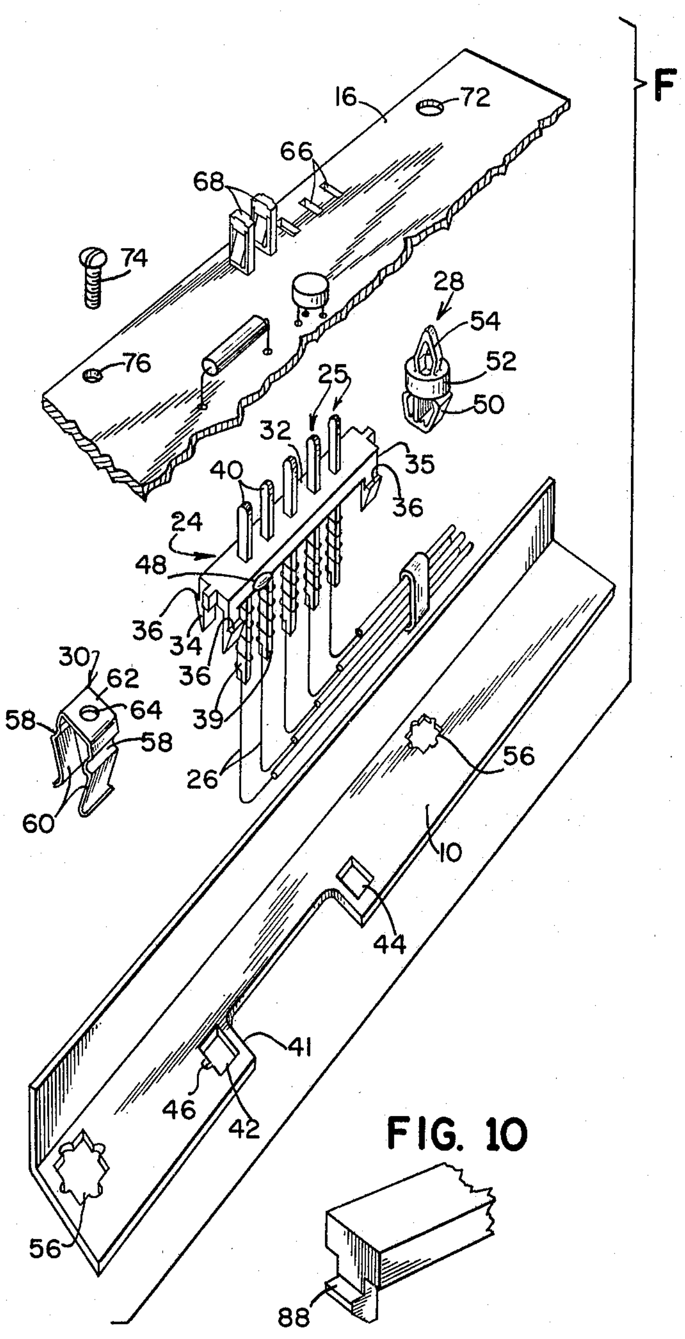
FIG. 3 illustrates an exploded view of a panel connector plug, chassis and spacers.
Figure 6:
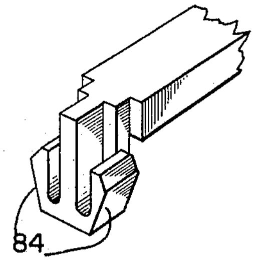

Reference is now made to FIGS. 2 and 3 which illustrate the mounting of one panel such as panel 16. The connector plug 24 is molded in a single cavity and comprises an elongated main body portion 32 generally rectangular in shape, and a pair of perpendicularly extending bifurcated legs 34 formed at one end of the portion 32 and a corresponding pair 35 formed at the other end. Each of the thus formed four legs has a lower portion which is tapered outwardly to form shoulders 36. A plurality of electrically conductive pins 25 extend perpendicularly through portion 32 of plug 24 to form pin portions 39 and 40. Conductors from other panels and circuits on chassis are wound around the portions 39 with a wire wrapping tool, for example. The pin portions 39 may have shoulders adjacent the undersurface of main body portion 32 to prevent the pins from being pushed through by the wire wrapping tool.

The chassis 10 has a regular opening 41, preferably with one side open as shown to form a notch and a pair of slots 42 and 44 adjacent opening 41. The legs 34 are flexed toward one another to permit insertion in the slot 42 and similarly the legs 35 are flexed toward one another to permit insertion in the slot 44, and similarly the legs 35 are flexed toward one another to permit insertion in the slot 44. Due to the outward bias of the legs 34 and 35 and the fact that the shoulders 36 mate with the undersurface of the chassis 10, the chassis 10 securely retains the connector plug 24 upon release of the legs. The slot 42 has a notch 46 and the connector plug 24 has a nub 48 to inform the individual putting the assembly together that the plug 24 is to be installed such that the nub 48 is closest to the slot 42 having the notch 46. It should be noted that by forming the opening 41 in the form of a rectangular notch, the pin portions 39 on the plug 24 may be connected to the conductors 26 prior to assembly. This means that a single harness for the entire receiver may be prepared having all the connector plugs and conductors formed into the desired pattern.

The insulating spacer 28 for locating and positioning panel 16 is, for example, formed of nylon and is composed of a pair of bifurcated legs 50, a central cylindrical portion 52, and a bowed V-shaped portion 54. The chassis 10 has a generally square shaped opening 56 to receive the bifurcated legs 50 in a flexed position. Release of the legs causes retention of the spacer 28 by the chassis 10. The height of portion 52 is sufficient to prevent shorting of the soldering 22 on conductor strips 19 (FIG. 1) to the chassis 10. The conductive spacer 30 for locating and positioning panel 16 has a generally arched shape cross-section and has a pair of grooves 58 and a pair of legs 60 sloping toward one another. The spacer 30 also has a flat top 62 with a threaded aperture 64. The opening 56 in the chassis 10 receives the spacer 30, when the legs 60 are flexed toward one another. Two opposing sides of the opening 56 extend into the grooves 58 so that upon release of the legs 60, the spacer 30 is retained by the chassis 10.

The panel 16 has a plurality of rectangular openings 66 for permanently retaining a corresponding plurality of receptacles or sockets 68 (in a finished product, each opening would have a socket). The interior of the sockets 68 has a shape to conform with the shape of the pin portions 40 of the pin 25 on the connector plug 24. Each socket 68 has inwardly bowed portions on two opposing sides to bear against the pin portions 40 to provide a secure electrical and mechanical connection.

The panel 16 has an aperture 72 which receives the bowed V-shaped portion 54 of the insulating spacer 28. A screw 74 inserted through another aperture 76 in the panel 16 and rotated in the aperture 64 in the conductive spacer 30 provides mechanical mounting and electrical connection between certain ones of the conductive strips 19 (FIG. 1) and the chassis 10. Alternatively, a spacer which is conductive but having a shape similar to that of spacer 28 may be used.

Figure 4:
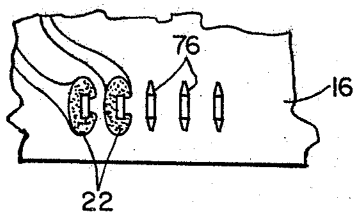
FIG. 4 illustrates a portion of the plated side of a printed circuit board panel showing the sockets.

FIG. 4 illustrates a portion of the pattern side of the panel 16 and indicates that the sockets 68 comprise a pair of extensions 76 which once inserted through the opening 66 are bent so as to overlay the panel. In order to prevent solder from traveling within the socket 68, solder resist is put on one of the sides so that the solder will extend only around three sides, as shown.

Because of their small size, the use of semiconductor devices has made a modular approach incorporating the features just explained feasible in television receivers. In other words, each system in the receiver is mounted on an individual panel. For example, there may be an audio panel, a video IF panel, a video amplifier panel, a color panel, etc. The service manual accompanying a receiver would include a number of charts each corresponding to a particular malfunction. For example, if the sound and picture were normal but there was no vertical or horizontal synchronization, a serviceman would refer to the appropriate chart which would contain a suggested action and a question asking the results of the suggested action. Depending on what the answer was, the serviceman would either go further or would then have an indication as to where the malfunction occurred.

Suppose that panel 16 corresponds to the video amplifier panel of a television receiver and suppose further that after the suggested action is taken according to the appropriate chart entitled, "No Vertical or Horizontal Sync But Normal Sound and Picture," the conclusion was that the video amplifier panel was defective. The serviceman would determine from the mechanical layout chart where the panel was located and would proceed to remove the entire panel. The removal procedure would involve slipping the panel off of the insulating spacer 28 and unscrewing the screw 74 to disengage the panel from the conductive spacer 30. The serviceman would then simply pull the panel away from the chassis 10 to disengage the sockets 68 from the pins 25. Of course other spacers and connector plugs may be involved. The simplicity and ease of servicing is apparent for there is no requirement that the serviceman heat up solder joints to remove one or more components and thereby subject the board to damage. There is no requirement that he clean out the holes for receiving the components and there is no requirement that he replace it with a new component and solder its leads in. The time saved is considerable thereby resulting in an overall cost saving to the owner of such a television receiver. Of equal importance is the fact that the chassis 10 securely retains the panel 16 by use of the spacers 28 and 30 so that there is no chance of dislodging the panel during normal operation.

Figure 5:
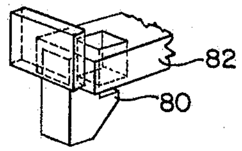
FIGS. 5–10 illustrate other forms of the connector plug.
Figure 7:
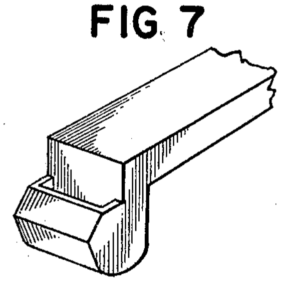
Figure 8:
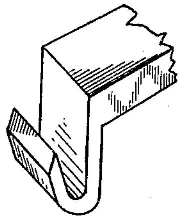
Figure 9:
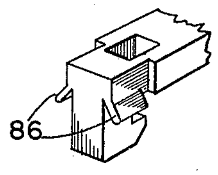

Other embodiments for the construction of the members at the ends of the connector plug 24 for securing the same to the chassis 10 are shown in FIGS. 5–10. In FIG. 5 a slot is formed between portions 80 and 82 so that upon insertion of portion 80 in an appropriately shaped opening, the edge of chassis 10 will fit into the slot. The embodiment of FIG. 6 has a pair of bifurcated legs 84 which spread upon insertion in a chassis opening. FIGS. 7 and 8 are similar in that they have a U-shaped cross-section with outwardly biased legs. In addition, FIG. 7 has webbing on both sides of the legs to provide a stronger outward bias effect. The embodiment of FIG. 9 is similar to that of FIG. 5 but additionally has a pair of wings 86 which bear against the upper surface of the chassis 10 to provide additional retention. The plug of FIG. 10 has a shoulder 88 to engage the bottom surface of the chassis 10.

What has been described, therefore, is an assembly comprising a number of individual panels mounted on a chassis and easily and rapidly removable therefrom.

We claim:

1. An assembly including in combination; a chassis having an opening and a plurality of selectively spaced slots, a connector plug having first and second opposing surfaces, a plurality of members on said plug and spaced to individually align with associated ones of said slots in said chassis, said members each including means individually snap engaging associated ones of said slots to cause said chassis to securely retain said connector plug, a plurality of selectively spaced electrically conductive pin means attached to said connector plug each having a first portion extending from said first surface of said connector plug and through said opening in said chassis, each of said pin means having a second portion extending from said second surface of said plug, a panel with electrical components mounted thereon and having a plurality of sockets each individually removably receiving an associated one of said second portion of said pin means, circuit means, a plurality of conductor means coupled between associated ones of said first portions of said pin means and said circuit means for coupling electric current between said circuit means and said electrical components on said panel.

2. The assembly set forth in claim 1 wherein said opening is generally rectangular in shape and has a pair of short sides, wherein said pluality of selectively spaced slots number two and are individually adjacent an associated one of said short sides, wherein said connector plug has a generally rectangular shape and a pair of end portions overlying said chassis, wherein said plurality of members number two and are respectively integrally formed on said end portions and are substantially perpendicular to said surfaces of said connector plug.

3. The assembly set forth in claim 1 wherein each of said members comprises a pair of bifurcated legs which may be flexed toward one another to permit insertion thereof into an associated one of said slots, and a shoulder on each of said legs engaging the surface of said chassis.

4. The assembly set forth in claim 1 wherein said opening is in the form of a rectangular notch to permit snapping said connector plug onto said chassis after said conductor meeans are coupled to said first portions of said pin means.

5. The assembly set forth in claim 1 wherein each of said conductor means is coupled to an associated one of said first portions of said pin means.

6. The assembly set forth in claim 1 further including a plurality of spacers interposed between said panel and said chassis.

7. The assembly set forth in claim 6 wherein at least one of said spacers is formed of an insulating material, and wherein at least one of said spacers is formed of a conductive material to provide electrical connection between said chassis and certain ones of said components.

8. The assembly set forth in claim 1 wherein said plug and said chassis have means for orientating the position of said plug with respect to said chassis.

9. An assembly set forth in claim 1 wherein said panel comprises a printed circuit board with conductive pathway patterns for interconnecting said electrical components and said sockets.

10. The assembly set forth in claim 9 wherein, said printed circuit board includes a plurality of sockets being positioned opposite one of said rectangular holes, each of said associated one of said second portion of said pin means extending through said hole into said socket, one of said conductive pathways extending to each of said holes for solder connection to the socket associated therewith, solder resist means adjacent at least one side of each of said holes to prevent adherence of solder along said one side whereby solder is prevented from entering said socket.

References Cited

UNITED STATES PATENTS

| | | | |
|---|---|---|---|
| 3,027,417 | 3/1962 | Turner. | |
| 3,394,287 | 7/1968 | Zitzmann et al. | 317—99 |

LEWIS H. MYERS, Primary Examiner

D. A. TONE, Assistant Examiner

U.S. Cl. X.R.

339—128